US007885387B2

(12) United States Patent (10) Patent No.: US 7,885,387 B2
Nagai et al. (45) Date of Patent: Feb. 8, 2011

(54) EXTREME ULTRAVIOLET LIGHT AND X-RAY SOURCE TARGET AND MANUFACTURING METHOD THEREOF

(75) Inventors: Keiji Nagai, Suita (JP); Qincui Gu, New York, NY (US); Takayoshi Norimatsu, Minoh (JP); Shinsuke Fujioka, Amagasaki (JP); Hiroaki Nishimura, Toyonaka (JP); Katsunobu Nishihara, Toyono-gun (JP); Noriaki Miyanaga, Minoh (JP); Yasukazu Izawa, Ibaraki (JP)

(73) Assignee: Osaka University, Osaka (JP)

( * ) Notice: Subject to any disclaimer, the term of this patent is extended or adjusted under 35 U.S.C. 154(b) by 385 days.

(21) Appl. No.: 11/792,923

(22) PCT Filed: Aug. 29, 2005

(86) PCT No.: PCT/JP2005/015621

§ 371 (c)(1),
(2), (4) Date: Jun. 13, 2007

(87) PCT Pub. No.: WO2006/064592

PCT Pub. Date: Jun. 22, 2006

(65) Prior Publication Data

US 2008/0157011 A1 Jul. 3, 2008

(30) Foreign Application Priority Data

Dec. 17, 2004 (JP) .............................. 2004-366732
Feb. 22, 2005 (JP) .............................. 2005-045005

(51) Int. Cl.
*H05G 2/00* (2006.01)
(52) U.S. Cl. .......................... 378/143; 378/34; 378/119; 250/504 R

(58) Field of Classification Search ................. 378/119, 378/143, 34; 250/504 R
See application file for complete search history.

(56) References Cited

U.S. PATENT DOCUMENTS 3,576,997 A * 5/1971 Slavin ........................ 378/137

(Continued)

FOREIGN PATENT DOCUMENTS

EP                43503 A1 * 1/1982

(Continued)

OTHER PUBLICATIONS

Mar. 9, 2010 Office Action for Japanese Patent Application No. 2006-548695 (with English-language translation).

*Primary Examiner*—Edward J Glick
*Assistant Examiner*—Thomas R Artman
(74) *Attorney, Agent, or Firm*—Oliff & Berridge, PLC

(57) ABSTRACT

The present invention is made to provide an extreme ultraviolet light source target or an X-ray source target having a good operationality. An extreme ultraviolet light source target in accordance with an aspect of the present invention is obtained by including a heavy metal such as tin into a matrix made of a polymeric material such as hydroxylpropylcellulose (HPC). The target can be manufactured by mixing the heavy metal and the polymeric material with a solvent, and evaporating the solvent. Since the target uses the polymeric material as a matrix, the target can be easily deformed to have a desired shape. For this reason, the target can be easily attached to a target holder irrespective of the shape of the holder, resulting in a good operationality of the target. Furthermore, an emission efficiency can be improved by including the heavy metal at a low density.

8 Claims, 8 Drawing Sheets

U.S. PATENT DOCUMENTS

| | | | |
|---|---|---|---|
| 5,991,360 A * | 11/1999 | Matsui et al. | 378/119 |
| 6,503,995 B2 * | 1/2003 | Tsuji et al. | 528/31 |
| 6,507,641 B1 * | 1/2003 | Kondo et al. | 378/119 |
| 6,865,255 B2 * | 3/2005 | Richardson | 378/119 |
| 7,087,914 B2 * | 8/2006 | Akins et al. | 250/504 R |
| 7,180,981 B2 * | 2/2007 | Wang | 378/124 |
| 2002/0094063 A1 * | 7/2002 | Nishimura et al. | 378/119 |
| 2005/0211910 A1 * | 9/2005 | Bloom et al. | 250/423 P |
| 2006/0133574 A1 * | 6/2006 | Nagai et al. | 378/119 |

FOREIGN PATENT DOCUMENTS

| | | |
|---|---|---|
| JP | A 11-345698 | 12/1999 |
| JP | A 2004-39927 | 2/2004 |
| JP | A 2004-213993 | 7/2004 |
| JP | A 2004-214013 | 7/2004 |
| WO | WO 01/31678 A1 | 5/2001 |
| WO | WO 2004/086467 A1 | 10/2004 |

* cited by examiner

EXTREME ULTRAVIOLET LIGHT AND X-RAY SOURCE TARGET AND MANUFACTURING METHOD THEREOF

TECHNICAL FIELD

The present invention relates to a target for generating an extreme ultraviolet light having wavelength of 1 to 100 nm and an X-ray having wavelength of 1 nm or less, and a manufacturing method of the target. The extreme ultraviolet light generated with the target can be suitably used in a lithographic process for manufacturing semiconductor devices.

BACKGROUND ART

Semiconductor integrated circuits are generally manufactured using a lithographic process. Since the minimum processing dimension of lithography depends on the wavelength of light used, it is necessary to shorten the wavelength of the irradiated light in order to improve the integration degree of the integrated circuit. Specifically, the lithographic process is, at present, performed using a light source having a wavelength of 157 nm to 365 nm. An object is to achieve the practical use of the lithography using an extreme ultraviolet light source having a wavelength 11 nm to 14 nm.

As a light source for generating the extreme ultraviolet light, a light source using a laser plasma method has been studied. According to this method, a target is irradiated with a laser beam to form plasma, and extreme ultraviolet light emitted from the plasma is used.

The emission efficiency of the extreme ultraviolet light will be described referring to FIG. 1. Regarding the horizontal axis, the position 0 μm corresponds to the position of a surface of a target (reference numeral 15), the region with a negative value in the horizontal axis (left region from the surface 15) corresponds to the inside of the target and the region with a positive value in the horizontal axis (right region from the surface 15) corresponds to the outside of the target. When the target is irradiated with a laser beam from the right end toward the left side in the graph, that is, in the direction of an arrow 13, the surface of the target is ablated and plasma blows out to the outside of the target. The plasma is in a quasi steady state while the intensity of the laser beam is constant. Distribution curves 18 and 19 show atomic density of elements which form the target and the plasma. The distribution curves 18 and 19 in the region with a negative value in the horizontal axis show the atomic density (initial density) of the target in the solid state, and those in the region with a positive value in the horizontal axis show the plasma density of the elements. The plasma density exponentially decreases as the distance from the surface 15 is larger.

The energy of the laser beam irradiated to the target is absorbed in a laser absorption region 11. The absorbed energy is, as shown by a reference numeral 14, transported from the laser absorption region 11 to an extreme ultraviolet light emission region 12. The extreme ultraviolet light is emitted in the extreme ultraviolet light emission region 12 owing to the transported energy.

The inventors found that an energy loss occurs during transport of the energy between the two regions and came to the idea that by adjusting the density of the target so as to make the distance between the laser absorption region and the extreme ultraviolet light emission region smaller, the emission efficiency of the extreme ultraviolet light can be improved (Patent document 1). The principle is as follows.

The density of the plasma generated when the target is irradiated with the laser beam depends on the initial density of the target. When the target initial density is high, the plasma exists widely from the surface (distribution curve 18) and when the target initial density is low, the plasma exists only in the vicinity of the surface (distribution curve 19). The laser absorption region 11 is a so-called cut-off electron density region of the plasma, which is defined according to the following equation. That is, with respect to the wavelength λ of the laser beam, $$c/\lambda = [(e^2 n_{cr})/(\epsilon_0 m_e)]^{1/2} \tag{1}$$

(where c, e, $\epsilon_0$, $m_e$, $n_{cr}$ are light velocity, unit charge amount, vacuum dielectric constant, electron mass and electron density, respectively). As the target initial density becomes smaller, the cut-off density region moves toward the surface 15 (to a downstream region with respect to the direction of the laser beam irradiation) (arrow 17). On the other hand, the condition by which the plasma emits the extreme ultraviolet light depends on temperature as well as density, and the extreme ultraviolet light emission region 12 is closer to the target surface when the target initial density is low compared to the high target initial density. To make the laser absorption region 11 closer to the extreme ultraviolet light emission region 12, the density of the target should be made small. Thus, in patent document 1, a low-density target is used and the density of the low-density target is 0.5% to 80% of the crystal density of the heavy metal.

However, a plasma having a lower density than the density of the emission region exists in the far side from the surface 15 when viewed from the emission region (an upstream side of the laser beam). The plasma reabsorbs the extreme ultraviolet light and emits light having a longer wavelength than the extreme ultraviolet light. As a result, the emission efficiency of the extreme ultraviolet light is decreased. Thus, in Patent document 1, a low-density target such as a heavy metal (or heavy metal compound) target having a cavity therein or a frost-like heavy element target is used. Accordingly, by making [thickness×density] of the plasma generated on the upstream side of the emission region smaller, reabsorption of the extreme ultraviolet light can be suppressed.

The heavy metals used for the target include Ge (germanium), Zr (zirconium), Mo (molybdenum), Ag (silver), Sn (tin), La (lanthanum), Gd (gadolinium), W (tungsten). Among the metals, Sn has the highest absorption efficiency of laser beam and can emit the extreme ultraviolet light most efficiently. The wavelength of the extreme ultraviolet light obtained from the target using Sn is 13.5 nm. By using Cu or Mo as the heavy metal, an X-ray of a shorter wavelength can be obtained.

[Patent document 1] International Publication No. WO2004/086467 (page 3, line 1 to page 5, line 20, and FIGS. 1 to 3 and FIG. 5)

DISCLOSURE OF THE INVENTION

Problems to be Solved by the Invention

When the frost-like heavy element target is used, it is necessary to generate the target on the scene and put the target to a laser beam irradiation region, and a necessary amount of target cannot be fixedly disposed. Furthermore, although the above-described heavy metal target with cavity can be formed in a desired shape when it is manufactured, it is difficult to be deformed after it is manufactured. This becomes problematic when the heavy metal target is to be attached to an extreme ultraviolet light source. For this reason, there is a demand for the heavy metal target of good operationality (handling).

When the extreme ultraviolet light source target is irradiated with the laser beam, a part of the target turns into particles without generating plasma and the particles (debris) disperse from the target. When the debris fall on the optical system or the like, or damages the optical system or the like, the problem is that the precision of the system is deteriorated. It is also necessary to suppress such debris.

An object of the present invention is to provide an extreme ultraviolet light source target having a good operationality. According to the present invention, the extreme ultraviolet light source target capable of preventing the debris can be also realized. The present invention can be also applied to the target for generating an X-ray in addition to the extreme ultraviolet light source target.

Means for Solving the Problems (1) Extreme Ultraviolet Light and X-Ray Source Target In an extreme ultraviolet light and X-ray source target in accordance with a first aspect of the present invention made to achieve the above-described object, the target is composed of a matrix made of a polymeric material containing heavy metal.

It is preferred that the extreme ultraviolet light and X-ray source target in accordance with the first aspect is formed in the shape of a thin film.

An extreme ultraviolet light and X-ray source target in accordance with a second aspect of the present invention contains a heavy metal with such an amount that it is just consumed by being irradiated with a laser beam of predetermined strength for a predetermined time.

In the extreme ultraviolet light and X-ray source target in accordance with the second aspect, the target may be made in the shape of a hollow capsule or a solid bead of heavy metal with the above-described amount or of compound containing heavy metal of the above-described amount. Alternatively, the target may be formed by coating a core with the heavy metal of said amount or the compound containing the heavy metal of the amount.

In accordance with the first and second aspects, desirably, the density of the heavy metal is 0.5% to 80% of the crystal density of the heavy metal, more desirably, 0.5% to 30% of the crystal density of the heavy metal.

(2) Method of Manufacturing the Extreme Ultraviolet Light and X-Ray Source Target According to the method of manufacturing the extreme ultraviolet light and X-ray source target in accordance with the first aspect, a heavy metal and a polymeric material are mixed with a solvent and then, the solvent is evaporated.

The method of manufacturing the solid or hollow capsule-like extreme ultraviolet light and X-ray source target in accordance with the second aspect has steps of:

a) preparing a heavy metal solution by dissolving the heavy metal or compound containing the heavy metal in a water-based solvent, and a resin solution obtained by dissolving a resin in an oil-based solvent;

b) preparing a drop of double-layer structure formed of the resin solution as an outer layer and the heavy metal solution containing the heavy metal as an inner layer by immersing a front end of a double tube formed of an outer tube and an inner tube in a drop dispersion medium made of a water-based solution and discharging the resin solution from the outer tube and the heavy metal solution from the inner tube at a predetermined flow rate, and dispersing the drop in the drop dispersion medium;

c) removing the oil-based solvent component in the resin solution as the outer layer of the drop;

d) removing the water-based solvent in the heavy metal solution by drying the water-based solvent under a predetermined temperature; and e) removing the resin by heating the resin at a predetermined temperature higher than the drying temperature.

Another method of manufacturing a solid or hollow capsule-like extreme ultraviolet light and X-ray source target has steps of:

a) preparing a heavy metal solution by dissolving a heavy metal or compound containing the heavy metal in a solvent;

b) preparing a drop containing the heavy metal of said amount by discharging the heavy metal solution at a predetermined flow rate; and c) removing the solvent in the drop.

A method of manufacturing a capsule-like extreme ultraviolet light and X-ray source target coating the core in accordance with the second aspect has steps of:

a) preparing a heavy metal solution obtained by dissolving a heavy metal or a compound containing the heavy metal in a solvent; and b) forming a coating by immersing the core in the heavy metal solution, taking the core out of the heavy metal solution and removing the solvent in the heavy metal solution attached to the core after.

(3) Extreme Ultraviolet Light and X-Ray Generating Apparatus

An extreme ultraviolet light and X-ray generating apparatus using the target in accordance with the first aspect has:

a cylindrical target holder for holding the target on its side, the target being wrapped around the target holder;

an irradiation device for irradiating the side surface of the target holder with a laser beam;

a rotating means for rotating the target holder around the central axis of the cylinder; and a moving means for moving a relative position between the target holder and the laser beam in the central axis direction.

Another extreme ultraviolet light and X-ray generating apparatus using the thin film target has:

a cylindrical target holder for placing and holding the target on the surface;

an irradiation device for irradiating the surface of the target holder with a laser beam;

rotating means for rotating the target holder around a central axis perpendicular to the surface; and moving means for moving a relative position between the target holder and the laser beam in parallel with the surface.

An extreme ultraviolet light and X-ray generating apparatus using the hollow target, the solid target or the coated-core target in accordance with the second aspect has:

an extreme ultraviolet light and X-ray source target feeding device for feeding any of these targets one by one to a predetermined region on a predetermined cycle;

a laser beam source for emitting the pulse laser beam having a pulse width with the predetermined strength for the predetermined time to the predetermined region and the predetermined cycle in sync with feeding of the extreme ultraviolet light and X-ray source target to the predetermined region.

EXPLANATION OF REFERENCE NUMERALS

Figure 1:
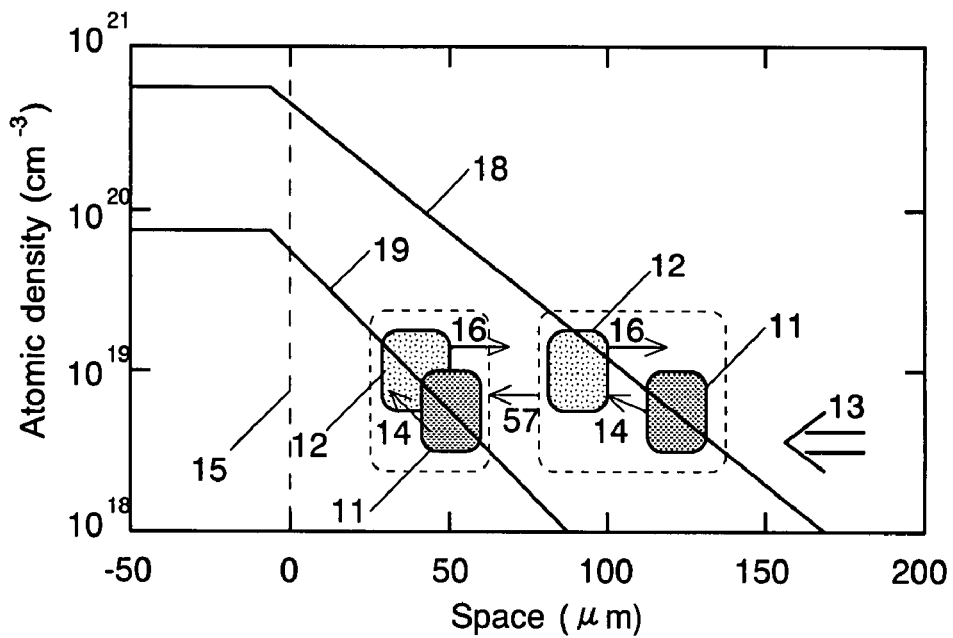
FIG. 1 An illustration of a principle of generation of an extreme ultraviolet light.

11 . . . Laser absorption region
12 . . . Extreme ultraviolet light emission region
13 . . . Arrow
14 . . . Reference numeral
15 . . . Surface
15 . . . Reference numeral
17 . . . Arrow
18 . . . Distribution curve
19 . . . Distribution curve
21 . . . Tin chloride-ethanol solution
22 . . . Tin chloride-ethanol-water solution
23 . . . Compound liquid of tin chloride-ethanol-water solution and hydroxylpropylcellulose
24 . . . Substrate
25, 311, 312 . . . Extreme ultraviolet light source target
321 . . . Cylindrical target holder
322 . . . Plate-like target holder
331, 332 . . . Central axis
34, 74 . . . Pulse laser beam
351, 352 . . . Laser beam track
41 . . . Hollow heavy metal capsule
41a . . . Tin oxide
41b . . . Cavity
42 . . . Solid heavy metal compound bead
43 . . . Core-coated target
43a . . . Tin oxide
43b . . . Core
51 Tin solution
52 . . . Polystyrene oil
53 . . . Double tube
53a . . . Inner tube
53b . . . Outer tube
54 . . . Drop dispersion medium
55 Drop
56 . . . Heavy metal solution inclusion resin capsule
56a . . . Resin capsule
57 . . . Heavy metal gel inclusion resin capsule
57a . . . Tin oxide
61 . . . Tin solution
62 . . . Tube
63 . . . Tower
64 . . . Drop
65 . . . Tin solution
71 . . . Extreme ultraviolet light source target in accordance with the second aspect
72 . . . Air gun
73 . . . Laser beam source
75 . . . Extreme ultraviolet light
76 . . . Target source
771, 772 . . . Electrode

MODES FOR CARRYING OUT THE INVENTION AND THEIR EFFECTS (1) Extreme Ultraviolet Light and X-Ray Source Target in Accordance with the First Aspect First, configuration of an extreme ultraviolet light and X-ray source target in accordance with a first aspect, a manufacturing method of the target, an extreme ultraviolet light and X-ray generating apparatus using the target (accompanying extreme ultraviolet light and X-ray generating method) and effects obtained by the extreme ultraviolet light and X-ray source target will be described.

(1-1) Configuration

The matrix of the target is a polymeric material. Although the target may be a bulk, preferably, is formed in the shape of a thin film. This is due to that a usage efficiency is improved since only the surface can be used as the target and flexibility is high.

The matrix of the target contains heavy metal. Available heavy metals include the same heavy metals as those used for conventional extreme ultraviolet light source targets, for example, Ge, Zr, Mo, Ag, Sn, La, Gd and W. Heavy metals such as Cu and Mo can be used for the X-ray source target.

Various materials may be used as the polymeric material forming the matrix of the target. However, it is desirable to use a polymer containing a hydroxyl group. This is due to that alcohol used as a solvent at manufacturing of the target and alkoxide generated from the heavy metal chemically bonds with the hydroxyl group in the polymer through exchange reaction so that the heavy metal may be uniformly contained at a molecular level. Polymers having the hydroxyl group include hydroxylpropylcellulose, poly(vinyl alcohol) and poly(vinyl phenol). Only one kind of the polymer having the hydroxyl group may be used or two kinds of the polymers may be mixed with each other and used. Alternatively, the polymer having the hydroxyl group may be mixed with other polymers.

It is desired that the density of the heavy metal is 0.5% to 80% of the crystal density of the heavy metal. As described in Patent document 1, this enables improvement in the emission efficiency of the extreme ultraviolet light. More desirably, the density of the heavy metal is 0.5% to 30% of the crystal density of the heavy metal. As a result, the target thus obtained becomes transparent with respect to a visible light. In the case of the transparent target, should the target have the heavy metal of nonuniform density, it can be found.

When the target is irradiated with the laser beam, the plasma of the heavy metal contained in the target is generated and extreme ultraviolet light or X-ray which has a wavelength corresponding to the kind of the heavy metal is emitted from the plasma. For example, when the heavy metal is Ge, the extreme ultraviolet light having the wavelength of 31.9 nm is emitted, when the heavy metal is Zr, the extreme ultraviolet light having the wavelength of 22.4 nm is emitted, when the heavy metal is Mo, the extreme ultraviolet light having the wavelength of 20.4 nm is emitted, when the heavy metal is Ag, the extreme ultraviolet light having the wavelength of 16.0 nm is emitted, when the heavy metal is Sn, the extreme ultraviolet light having the wavelength of 13.6 nm is emitted, when the heavy metal is La, the extreme ultraviolet light having the wavelength of 9.2 nm is emitted, when the heavy metal is Gd, the extreme ultraviolet light having the wavelength of 6.8 nm is emitted and when the heavy metal is W, the extreme ultraviolet light having the wavelength of 5.0 nm is emitted from the generated plasma. When the heavy metal is Cu, the X-ray having the wavelength of 0.154 nm is emitted and when the heavy metal is Mo, the X-ray having the wavelength of 0.071 nm is emitted from the plasma.

(1-2) Manufacturing Method

The target in accordance with the first aspect can be manufactured by mixing the heavy metal and the polymeric material with solvent and evaporating the solvent. For example, water, alcohol such as ethanol, and a compound liquid of water and alcohol may be used as the solvent. The heavy metal and the polymeric material may be dissolved in the solvent or dispersed without being dissolved. When the polymeric material contains the hydroxyl group, it is desired that the solvent contains the alcohol such as ethanol so that alkoxide may be generated from the heavy metal and the solvent material and the alkoxide may be chemically bonded with the hydroxyl group in the polymer.

Alternatively, a part of the polymeric material may be removed by heating it after evaporation of the solvent. Thereby, debris can be prevented from occurring from the polymeric material.

(1-3) Extreme Ultraviolet Light and X-Ray Generating Apparatus and Method

Since the target in accordance with the first aspect uses the matrix made of polymeric material, the target can be easily deformed in a desired shape. For this reason, when the target is formed to be, for example, a thin film, the target can be easily attached to a cylindrical target holder, to which the conventional non-deformable target is hard to be attached, by being wrapped around the surface of the holder. Thus, the extreme ultraviolet light and X-ray generating apparatus is provided with the target holder, an irradiation device for irradiating the laser beam to a side surface of the target holder, a rotating means for rotating the target holder around an axis (central axis) passing substantially the center of the cylinder and a moving means for moving the relative position between the target holder and the laser beam in the central axis direction. When the target is irradiated with the laser beam while rotating the cylindrical target holder around which the target is wrapped about the central axis and at the same time moving the cylindrical target holder in parallel with the central axis, the laser beam irradiation forms a spiral track. Since almost all of the surface of the target can be utilized in this manner, the usage efficiency of the target is improved and a fresh irradiation surface can be exposed at a laser beam irradiation position at all times. Thus, the time during which one target can continuously operate can be extended.

By placing the target in accordance with the first aspect on a surface of a target holder and irradiating the target with the laser beam while rotating around an axis substantially perpendicular to the surface as the central axis and moving in parallel with the surface, a track of the laser beam irradiation trace can form a spiral track. Thereby, as in the case where the cylindrical target holder is used, since almost all of the surface of the target can be utilized, the usage efficiency of the target is improved, a fresh irradiation surface can be exposed at the laser beam irradiation position at all times and the time during which one target can continuously operate can be extended. In this case, the extreme ultraviolet light and X-ray generating apparatus is provided with the target holder for placing and holding the target on the surface, the irradiation device for irradiating the laser beam to the surface of the target holder, the rotating means for rotating the target holder around the central axis and a moving means for moving the relative position between the target holder and the laser beam in parallel with the surface.

The extreme ultraviolet light and X-ray generating apparatus may be further provided with a target exchange device for exchanging a used target with a new target. In the target exchange device, the target holder holding an unused target is moved to a laser beam irradiation position, the target holder is moved to the outside of the irradiation position after the use of the target, and the target holder holding another new unused target is moved to the irradiation position. In this case, the target together with the target holder is exchanged. On the other hand, the target exchange device may attach an unused target to the target holder, remove the used target from the target holder after use of the target and then, attach another new target to the target holder. In this case, the target exchange device exchanges only the target without exchanging the target holder.

The target in accordance with the first aspect may be processed in the shape of a tape. When the tape-like target is used, a new irradiation surface can be exposed at the laser beam irradiation position by easily moving the target, and similar to the cylindrical target and the like, a continuous operation of the light source becomes possible.

(2) Extreme Ultraviolet Light and X-Ray Source Target in Accordance with the Second Aspect (2-1) Configuration An extreme ultraviolet light and X-ray source target in accordance with a second aspect is made of a heavy metal or compound of heavy metal having the amount just consumed by being irradiated with a laser beam with a predetermined strength for a predetermined time. Generally, in the extreme ultraviolet light source, the extreme ultraviolet light is generated by irradiating the extreme ultraviolet light source target with a pulse laser beam. Accordingly, the amount of the heavy metal may be set depending on the strength and the pulse width (irradiation time) so that the target is just consumed by irradiation of one pulse of the laser beam. The same applies to the X-ray source.

In a conventional target, much more excessive target atoms exist compared to the number of photons of the extreme ultraviolet light generated when the target is irradiated with the pulse laser beam once, which contributes to the occurrence of the debris. On the contrary, in the extreme ultraviolet light and X-ray source target in accordance with the second aspect, since there are small number of target atoms which do not contribute to the occurrence of the debris when the target is irradiated with the pulse laser beam once, the occurrence of the debris can be prevented. Furthermore, the target can be used without any waste. In addition, since the amount of the target is adjusted to the amount for the irradiation of one pulse of laser beam, the used amount of the target can be appropriately adjusted by feeding one target per pulse of the laser beam.

Those skilled in the art could appropriately define the amount of the heavy metal. For example, when the extreme ultraviolet light source target is irradiated with the pulse laser beam having the strength of $10^{10}$ W/cm$^2$ and a pulse width of 5 nanoseconds, an Sn target having an amount corresponding to a metal crystal shaped like a disc having a thickness of 30 nm and a diameter of 500 μm, in other words, an Sn target having [density×thickness] of $2 \times 10^{-5}$ g/cm$^2$ satisfies the above-described condition.

More specifically, for example, the following first and second examples can be used as such extreme ultraviolet light and X-ray source target. These extreme ultraviolet light and X-ray source targets are suitable for holding a necessary amount of heavy metal or heavy metal compound.

The first example of the extreme ultraviolet light source target in accordance with the second aspect is the heavy metal or the heavy metal compound having the amount just consumed by being irradiated with the laser beam with a predetermined strength for a predetermined time in the shape of a hollow capsule or a solid bead (hollow heavy metal capsule, solid heavy metal compound bead). Since the extreme ultraviolet light source target does not contain any material other than heavy metal or heavy metal compound, the occurrence of the debris can be further prevented.

The second example of the extreme ultraviolet light source target in accordance with the second aspect is the target formed by coating a core with the heavy metal or the heavy metal compound having the amount just consumed by being irradiated with the laser beam with the predetermined strength and for the predetermined time (core-coated target). Polystyrene and the like may be used as the core. When the extreme ultraviolet light source target is used, by appropriately setting the irradiation condition of the laser beam, it is possible to prevent the core from having an effect on the emitting of the extreme ultraviolet light and contributing to the occurrence of debris.

In the extreme ultraviolet light and X-ray source target in accordance with the second aspect, as in the first aspect, such as Ge, Zr, Mo, Ag, Sn, La, Gd, W can be used as the heavy metal for the extreme ultraviolet light source, and Cu, Mo can be used as the heavy metal for the X-ray source. As in the first aspect, desirably, the density of the heavy metal is 0.5% to 80% of the crystal density of the heavy metal, more desirably, 0.5% to 30% of the crystal density of the heavy metal.

(2-2) Manufacturing Method

First to third methods of manufacturing the extreme ultraviolet light and X-ray source target in accordance with the second aspect will be described.

(2-2-1) First Manufacturing Method

First, a heavy metal which can become the extreme ultraviolet light and X-ray source target is dissolved in a water-based solvent to prepare a solution containing the heavy metal (heavy metal solution). For example, the heavy metal solution can be obtained by dissolving a chloride of the heavy metal in the water-based solvent. Water, ethanol or the mixture thereof is used as the water-based solvent. A resin solution is prepared by dissolving resin in the oil-based solvent such as fluorobenzene. Fluorobenzene or a mixture of benzene and 1,2-dichloroethane can be used as the oil-based solvent. Polystyrene or polymethyl methacrylate derivative can be used as the resin.

Next, a front end of a double tube formed of an outer tube and an inner tube is immersed in a drop dispersion medium made of a water-based solution, and the heavy metal solution and the resin solution are flown out from the front ends of the inner tube and the outer tube of the double tub, respectively. In this manner, the drop with a double-layer structure, which is formed of the resin solution on its outer portion and the heavy metal solution on its inner portion, can be dispersed in the drop dispersion medium. At this time, by adjusting the concentration and the flow rate of the heavy metal solution, the amount of the heavy metal in the drop is adjusted to have the amount just consumed when the extreme ultraviolet light source target is irradiated with the laser beam with the predetermined strength for the predetermined time. Since the size of the generated drop becomes substantially constant when the concentration and the flow rate of the heavy metal solution is set, those skilled in the art easily control the amount of the heavy metal in the drop through a simple preliminary experiment.

From the outer layer of the drop dispersed in the drop dispersion medium, the oil-based solvent in the resin solution is gradually dissolved in the drop dispersion medium. Finally, only the resin remains in the outer portion of the drop to form a capsule containing the heavy metal solution.

Next, the solvent in the heavy metal solution in the capsule is removed. To remove the solvent, the water-based solvent in the heavy metal solution in the capsule is evaporated through a shell of the capsule by drying the capsule including the heavy metal solution. The temperature to remove the solvent (drying temperature) is set depending on the material (resin) forming the shell of the capsule or the type of the water-based solvent in the heavy metal solution so that the water-based solvent may be evaporated without resolving the material for the capsule. For example, when the resin material for the capsule is polystyrene and the water-based solvent in the heavy metal solution is a mixture of water and ethanol, the drying temperature is set to room temperature to 80° C.

As a result, the remaining heavy metal or heavy metal compound is gelated and remains in the capsule. At this time, the heavy metal or the heavy metal compound is adhered to the inner wall surface of the capsule and becomes hollow when a gelating rate is high and becomes solid when the gelating rate is low. To increase the gelating rate, for example, a catalyst such as ammonia is mixed with the drop dispersion medium in advance. The catalyst passes through the outer layer of the drop and enters into the inner heavy metal solution, thereby accelerating gelation of the heavy metal solution.

By heating the heavy metal solution inclusion resin capsule at a temperature higher than the drying temperature, the shell of the capsule can be removed. As a result, only the heavy metal or the heavy metal compound remains in the resin capsule and the target (solid heavy metal capsule) formed of the heavy metal or heavy metal compound in the shape of the hollow capsule (hollow heavy metal capsule) or the solid bead. For example, when the material for the resin capsule is polystyrene, the heating temperature is set to 300° C. to 500° C.

According to the first manufacturing method, it is preferable to substantially overlap the specific gravity of the resin solution, the heavy metal solution and drop dispersion medium with each other. Thereby, since the force applied to the interface between the heavy metal solution and the resin solution becomes equal to the force applied to the interface between the resin solution and the drop dispersion medium, the extreme ultraviolet light source target substantially in the shape of a sphere can be obtained. The specific gravity of the resin solution, the heavy metal solution and the drop dispersion medium is adjusted by controlling the type and the concentration of the solution or the concentration of a solute. Alternatively, the specific gravity may be adjusted by mixing multiple kinds of solvents.

(2-2-2) Second Manufacturing Method

The heavy metal which can become the extreme ultraviolet light and X-ray source target is dissolved in the solvent to prepare a heavy metal solution. The solvent may be water-based or oil-based. A drop made of the heavy metal solution is prepared by flowing the heavy metal solution into a tube and emitting the solution into the dispersion medium or a vacuum chamber from the front end of the tube. At this time, by adjusting the concentration and the flow rate of the heavy metal solution, the amount of the heavy metal in the drop is adjusted to be the amount just consumed when the extreme ultraviolet light and X-ray source target is irradiated with the laser beam with the predetermined strength for the predetermined time. Next, by heating the dispersion medium and drawing vacuum in the vacuum chamber to achieve adiabatic expansion of the drop, the drop is gelated or solidified and the solvent in the heavy metal solution is removed. In this manner, a solid heavy metal compound bead can be obtained.

(2-2-3) Third Manufacturing Method

The heavy metal atom which can become the extreme ultraviolet light and X-ray source target is dissolved in the solvent to prepare a heavy metal solution. The solvent may be water-based or oil-based. A core is immersed in the heavy metal solution and taken out. Thereby, the heavy metal solution is adhered to the surface of the core. By heating the heavy metal solution on the surface of the core or drying the solution at normal temperatures, the solvent is removed. In this manner, the extreme ultraviolet light and X-ray source target (core-coated target) having the core of coated with the heavy metal or the heavy metal compound can be obtained.

(2-3) Extreme Ultraviolet Light and X-Ray Generating Apparatus and Method

An extreme ultraviolet light and X-ray generating apparatus using the target in accordance with the second aspect has a laser beam source for generating the pulse laser beam and a target feeding device for feeding the target in accordance with the second aspect one by one in the region where the laser beam source emits the pulse laser beam on a predetermined cycle. The pulse laser beam is emitted to the area in sync with feeding of the extreme ultraviolet light source target. The strength and the pulse width of the pulse laser beam and the amount of the heavy metal in the target are adjusted so that one target may be consumed at irradiation of the one pulse of the laser beam. For example, electrostatic field applying means for accelerating the target in an electrostatic field and letting the target through the laser beam irradiation region can be used as the target feeding device. Furthermore, it is desirable to adopt an air gun for emitting the target due to air pressure as the target feeding device because the air gun can continuously feed the target one by one.

(3) Effects of the Present Invention

The extreme ultraviolet light and X-ray source targets in accordance with the first and second aspects of the present invention have improved operationality (handling) compared to the conventional target.

Since the target in accordance with the first aspect uses the polymeric material as the matrix, the target can be easily deformed. For this reason, the target can be easily attached to the target holder, to which an undeformable target is hard to be attached, such as the cylindrical target holder having a curved surface. By deforming the target in accordance with the first aspect to be cylindrical or tape-like, a continuous operation of the light source becomes possible. Furthermore, the target in accordance with the second aspect has a good operationality in that it can be fed to the laser beam irradiation region without any waste by the amount consumed when being irradiated with the laser beam once.

By varying a ratio between the heavy metal and the polymeric material in the target in accordance with the first aspect, the density of the heavy metal can be easily controlled. Since the emission efficiency of the extreme ultraviolet light depends on the density of the heavy metal as described above, the target having a high emission efficiency can be obtained according to the first aspect of the present invention.

Since the target in accordance with the first aspect can be easily manufactured by mixing the heavy metal and the polymeric material with the solvent and drying the mixture, the target can be mass-produced.

Since the target in accordance with the second aspect is consumed by being irradiated with the laser beam once, there is no possibility that one extreme ultraviolet light source target is repeatedly irradiated with the pulse laser beam. Thus, it is possible to prevent deterioration of the target and occurrence of the debris.

EMBODIMENTS

Embodiments of the extreme ultraviolet light and X-ray source target in accordance with the first and second aspects of the present invention will be described below. Here, an extreme ultraviolet light source target using Sn is adopted to obtain the extreme ultraviolet light having a wavelength of 13.6 nm. However, the examples can be also applied to the extreme ultraviolet light and X-ray source target using other heavy metal.

(1) Embodiment of the Extreme Ultraviolet Light Source Target in Accordance with the First Aspect

Figure 2:
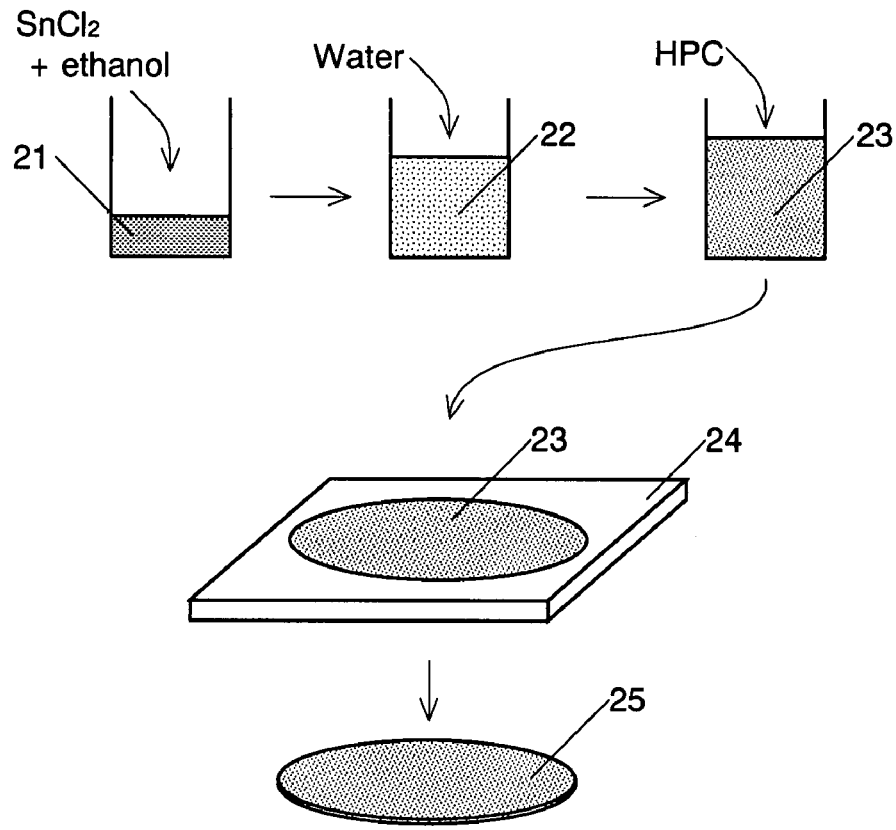
FIG. 2 A schematic view showing an embodiment of a method of manufacturing an extreme ultraviolet light source target in accordance with a first aspect of the present invention.

(1-1) Embodiment of a Method of Manufacturing the Extreme Ultraviolet Light Source Target in Accordance with the First Aspect First, the method of manufacturing the extreme ultra ultraviolet light source target using Sn as the heavy metal and hydroxylpropylcellulose (HPC) as the polymeric material will be described referring to FIG. 2.

Tin chloride ($SnCl_4$) is dissolved in ethanol with the volume ratio of 3:1 (solution 21). Purified water having the volume three times as much as the solution 21 is added to the solution 21 (solution 22). Hydroxypropylcellulose is dissolved in the solution with the weight ratio of 2% to 15%, preferably 10% (solution 23). The compound liquid 23 is thinly spread on a substrate 24 and the solvent is naturally evaporated under atmosphere.

In this manner, a thin film-like extreme ultraviolet light source target 25 having a thickness of about 100 μm is obtained. Sn is included in the target 25 in a state where Sn is connected to oxygen of hydroxyl group included in alkoxy group and HPC which is derived from alcohol in the solvent. The weight concentration of Sn in the target 25 is 10%.

The manufacturing method of the extreme ultraviolet light source target containing Sn and HPC is not limited to the above-described method. For example, a raw material which provides Sn is not limited to $SnCl_4$, and any Sn or Sn compound other than $SnCl_4$ may be used as long as it is dissolved or dispersed in the solvent. Similarly, any solvent other than the mixture of water and ethanol may be used as long as Sn or the Sn compound is dissolved or dispersed in the solvent. However, to chemically combine Sn with polymer in the target, it is desired that the solvent includes alcohol.

(1-2) Evaluation of the Obtained Target

Figure 3:
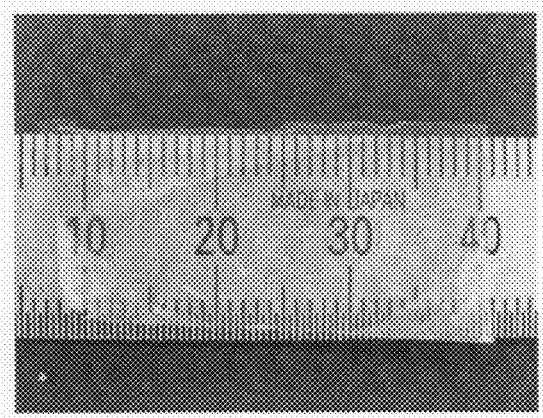
FIG. 3 A photo of the extreme ultraviolet light source target containing Sn and HPC in the embodiment in accordance with the first aspect.
Figure 4:
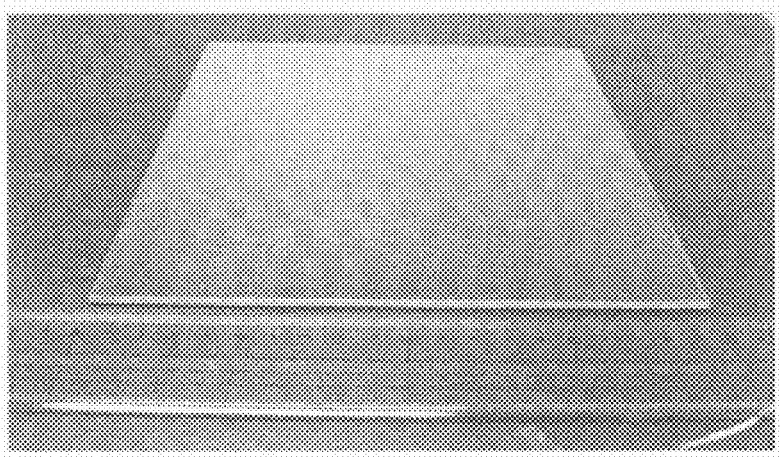
FIG. 4 A photo of a large extreme ultraviolet light source target containing Sn and HPC in the embodiment in accordance with the first aspect.
Figure 5:
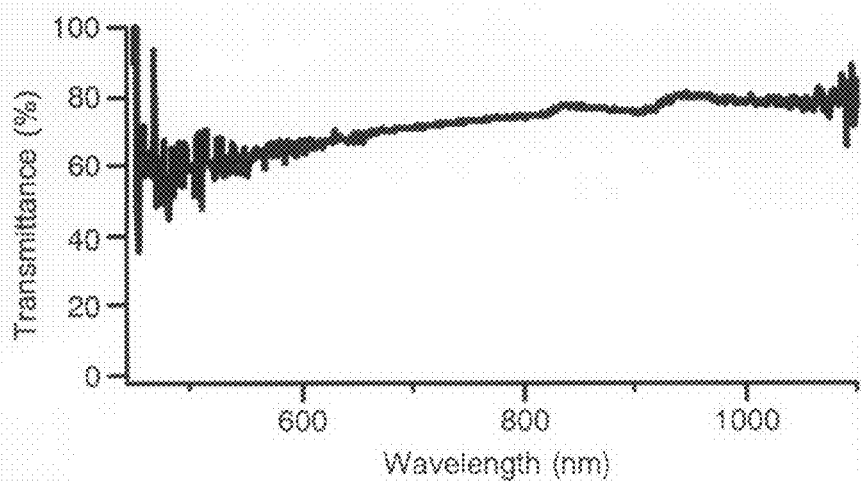
FIG. 5 A graph showing transmittance of the extreme ultraviolet light source target containing Sn and HPC in accordance with the first aspect.

The thickness of the extreme ultraviolet light source target including Sn and HPC which can be obtained according to the embodiment of the manufacturing method is about 100 μm. The target, as shown in FIG. 3, is transparent and colorless. When the transparency is uniform, it is determined that a homogeneous target is obtained. Furthermore, as shown in FIG. 4, a large target having a side of 20 cm can be obtained. FIG. 5 shows the transmittance in a wavelength band from a visible region to a near-infrared region of the extreme ultraviolet light source target including Sn and HPC. In the whole of the measured wavelength band, transmittance of about 60% or more can be acquired.

Figure 6:
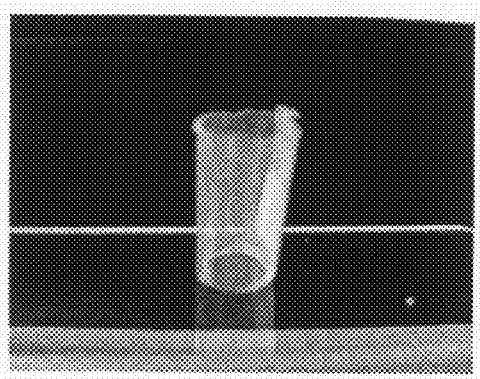
FIG. 6 A photo showing a state where the extreme ultraviolet light source target containing Sn and HPC in accordance with the first aspect is bent.

The target, as shown in FIG. 6, can be deformed in the desired shape such as a cylinder.

Figure 7:
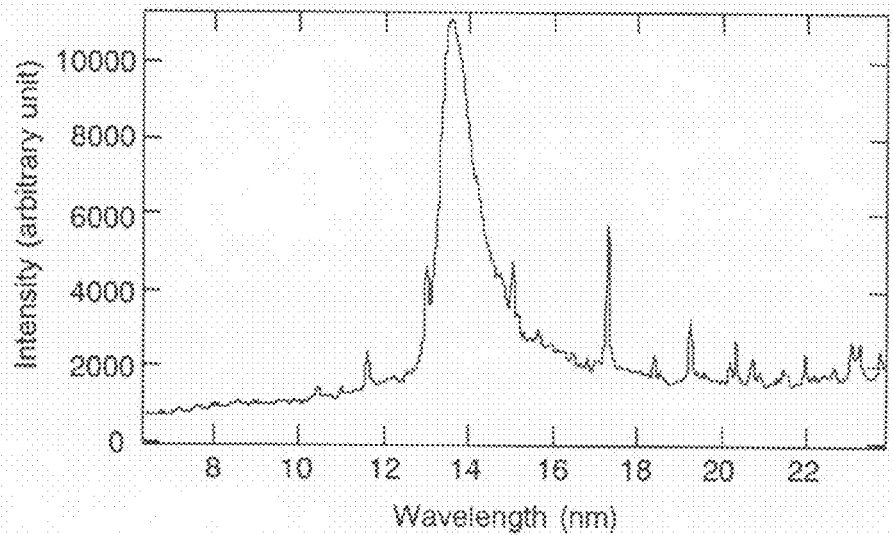
FIG. 7 A graph showing a spectrum of an extreme ultraviolet light obtained using the extreme ultraviolet light source target containing Sn and HPC in accordance with the first aspect.

An experiment in which the extreme ultraviolet light is generated by repeatedly irradiating the target with the pulse laser beam is carried out. In this experiment, the laser beam having the wavelength of 1064 nm and, pulse repetitive cycle of 10 Hz is used. FIG. 7 shows a spectrum of the generated extreme ultraviolet light. As in the conventional Sn target, it is confirmed that the extreme ultraviolet light having the wavelength of 13.6 nm is obtained.

Figure 8:
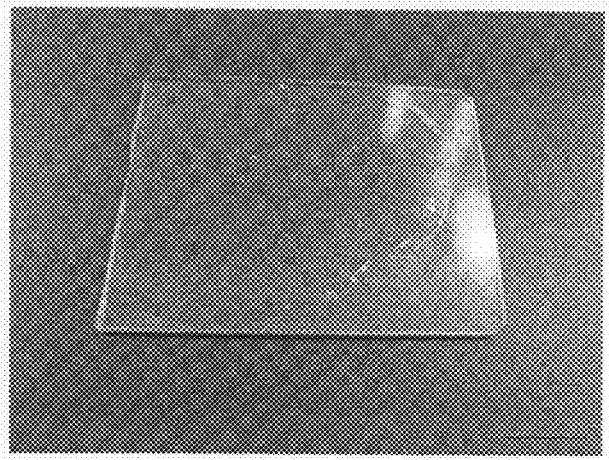
FIG. 8 A photo of an extreme ultraviolet light source target containing Sn and poly(vinyl alcohol) in an embodiment in accordance with the first aspect.

The extreme ultraviolet light source target including Sn and poly(vinyl alcohol) is manufactured according to the same method as the method of the ultraviolet light source target including Sn and HPC. FIG. 8 shows a photo of the obtained target. The transparent and reddish target is obtained.

Figure 9:
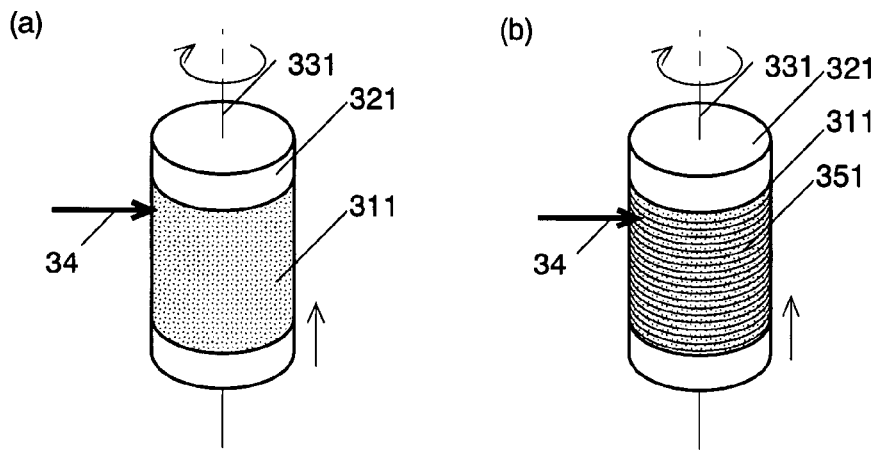
FIG. 9 A schematic view showing an example of a method of using the extreme ultraviolet light source target in accordance with the first aspect.

(1-3) Embodiment of a Method of Using the Extreme Ultraviolet Light Source Target in Accordance with the First Aspect An embodiment of a method of using the extreme ultraviolet light source target in accordance with the first aspect will be described referring to FIG. 9. A thin film-like extreme ultraviolet light source target 311 is wrapped around a cylindrical target holder 321 and held there (a). The target holder 321 may be made of aluminum, for example. The extreme ultraviolet light is generated by repeatedly irradiating the target 311 with a pulse laser beam 34. At this time, the target holder 321 or/and the pulse laser beam 34 is moved in the direction of a central axis 331 while rotating the target holder 321 around the central axis 331 of the target holder 321. The pulse laser beam 34 is emitted so as to draw a spiral track 351 on the surface of the target 311 (b). As a result, the target 311 can be fully utilized without any waste.

To use the extreme ultraviolet light in the lithographic process, the extreme ultraviolet light having the strength of about 150 W is required. Since an energy conversion efficiency from the pulse laser beam to the extreme ultraviolet light is about 3%, the extreme ultraviolet light having the strength of 750 W can be obtained by irradiating the target with a pulse laser beam having energy of 5 J and the pulse repetitive frequency of 5 kHz.

When the pulse laser beam having the pulse repetitive frequency of 1 kHz is used, in order to the extreme ultraviolet light for five minutes, the target needs to be irradiated with the pulse laser beam 300,000 times for five minutes. When the above-described cylindrical target holder (cylindrical holder) is used, given that the diameter is 33 cm, the axial length of the target is 30 cm, the rotation speed is one rotation/second and a moving speed toward the axial is 1 mm/second, it is possible to irradiate the target with the pulse laser beam at intervals of 1 mm and keep the state for five minutes. The required size of the thin film-like target is about 100 cm×30 cm and the thin film-like target having such size can be easily manufactured according to the present invention.

By adhering a compound liquid of the solution containing the heavy metal and the solution containing polymeric material to the surface of the cylindrical holder and drying the compound liquid instead of wrapping the previously manufactured target around the cylindrical holder, the target may be generated on the surface of the cylindrical holder. In this case, an operation for attaching the target is not required.

Figure 10:
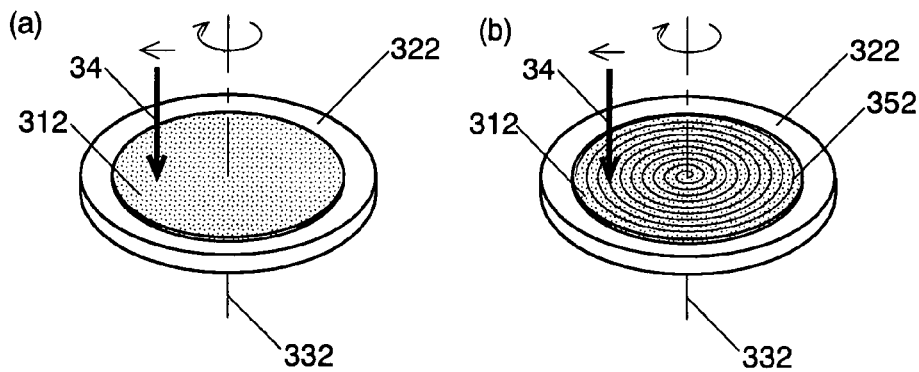
FIG. 10 A schematic view showing an example of a method of using the extreme ultraviolet light source target in accordance with the first aspect.

Another embodiment of a method of using the extreme ultraviolet light source target in accordance with the first aspect will be described referring to FIG. 10. The thin film-like extreme ultraviolet light source target 312 is placed and held on a disc-like target holder 322. The target holder 322 or/and the pulse laser beam 34 is moved in parallel with a panel surface of the target holder 322 while rotating the target holder 322 around a central axis 332 perpendicular to the panel surface of the target holder 322. Thereby, a surface of the target 312 is irradiated with the pulse laser beam 34 to draw a spiral track 352 (b). As in the case where the cylindrical holder is used, the target 312 can be irradiated with the pulse laser beam 34 a series of many times and the target 312 can be fully utilized without any waste. The rotation speed (angular velocity) of the target holder 322 may be constant. However, when the line speed of the pulse laser beam 34 on the track is controlled to be constant, the laser beam pulse is emitted to the target 312 at regular intervals, thereby improving a usage efficiency of the target 312.

Figure 11:
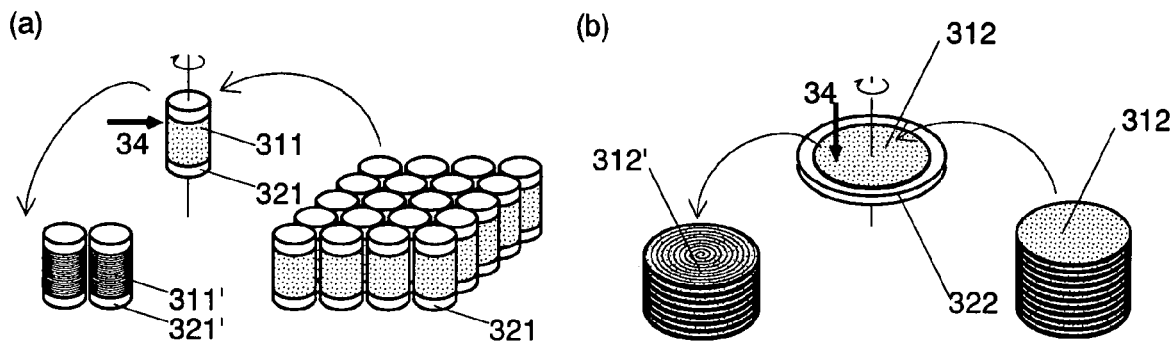
FIG. 11 A schematic view showing an example of a method of using the extreme ultraviolet light source target in accordance with the first aspect.

FIG. 11 is a conceptual diagram of a method of continuously using the extreme ultraviolet light source by exchanging a used target with an unused target.

In FIG. 11(a), a plurality of cylindrical target holders 321 around which the thin film-like extreme ultraviolet light source target 311 is wrapped in advance are prepared and one of the target holders 321 is moved to the irradiation position of the laser beam 34 and the extreme ultraviolet light source target 311 is used as described above. The used extreme ultraviolet light source target 311' is moved to the outside of the irradiation position of the laser beam 34 together with the target holder 321' and one of the plurality of prepared target holders 321 is moved to the irradiation position of the laser beam 34. By repeating this operation, the extreme ultraviolet light source can be continuously used.

In FIG. 11(b), a plurality of thin film-like extreme ultraviolet light source targets 312 are prepared and one of the extreme ultraviolet light source targets 312 is moved to the surface of the target holder 322 and placed there. The surface of the target holder 322 is irradiated with the laser beam 34 and the extreme ultraviolet light source target 312 is used as described above. The used extreme ultraviolet light source target 312' is detached from the target holder 322 and then, one of the plurality of prepared extreme ultraviolet light source targets 312 is moved to the surface of the target holder 322 and placed there. By repeating this operation, as in the case in FIG. 11(a), the extreme ultraviolet light source can be continuously used.

Figure 12:
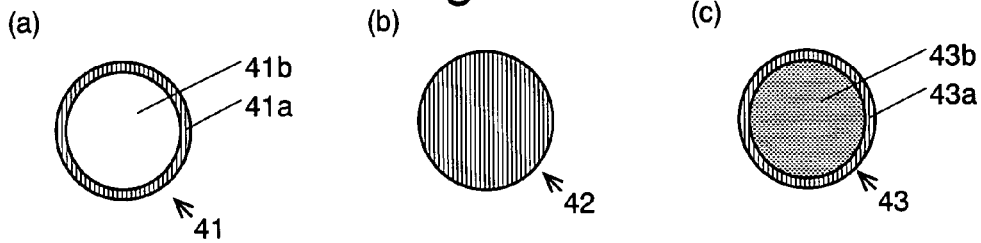
FIG. 12 A schematic view showing an example of an extreme ultraviolet light source target in accordance with a second aspect of the present invention.

(2) Embodiment of the Extreme Ultraviolet Light Source Target in Accordance with the Second Aspect (2-1) Example of Configuration of the Extreme Ultraviolet Light Source Target in Accordance with the Second Aspect FIG. 12(a) shows an example of a hollow heavy metal capsule 41, FIG. 12(b) shows an example of a solid heavy metal compound bead 42 and FIG. 12(c) shows an example of a core-coated target 43. These targets are substantially spherical. The hollow heavy metal capsule 41 is obtained by forming a cavity 41b in the center of a shell-like tin oxide 41a. The solid heavy metal compound bead 42 is made of a solid spherical tin oxide. The core-coated target 43 is obtained by adhering a tin oxide 43a to a surface of a spherical core 43b made of polystyrene.

Figure 13:
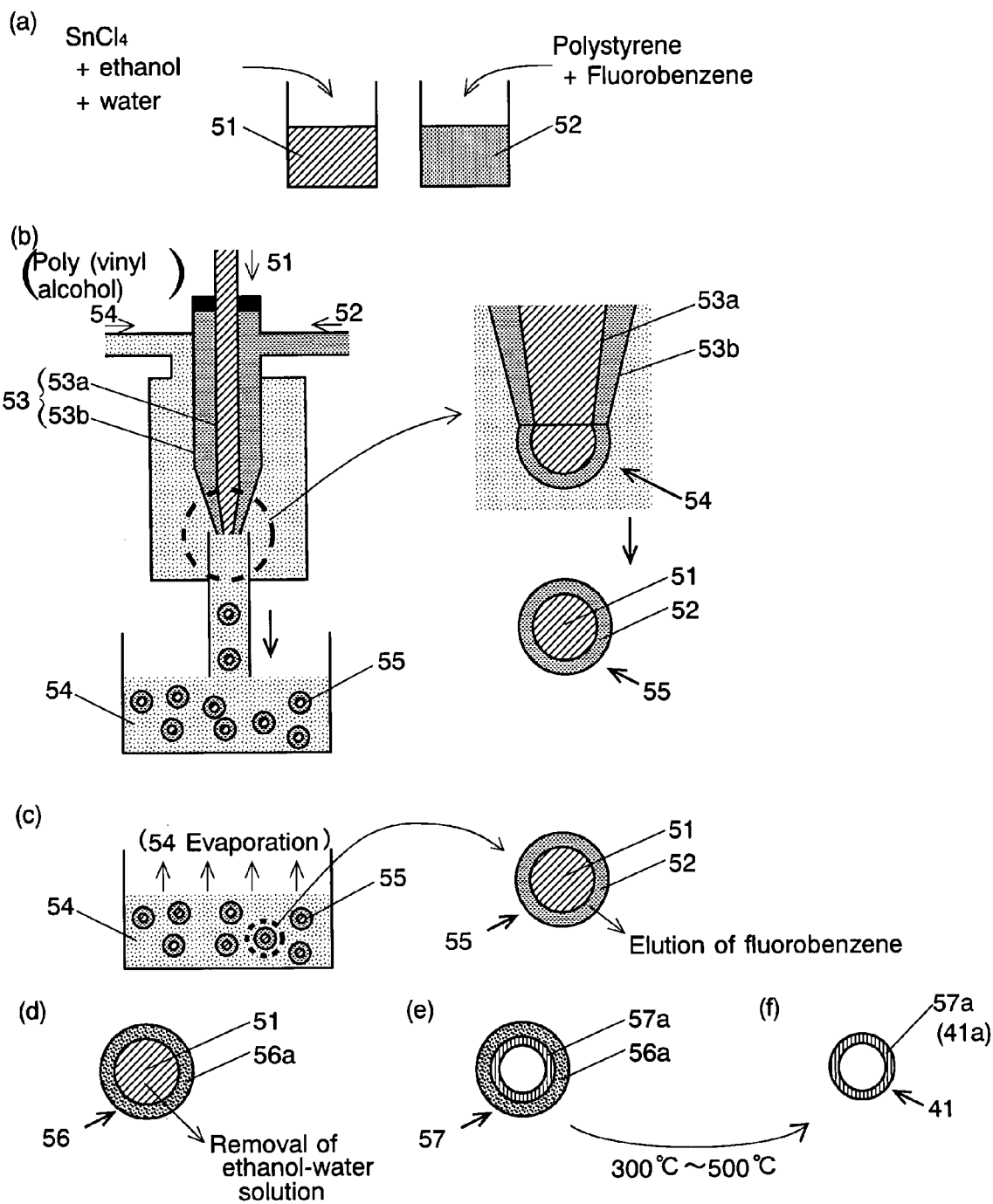
FIG. 13 A schematic view showing an example of a method of manufacturing a hollow heavy metal capsule as the extreme ultraviolet light source target in accordance with the second aspect.
Figure 14:
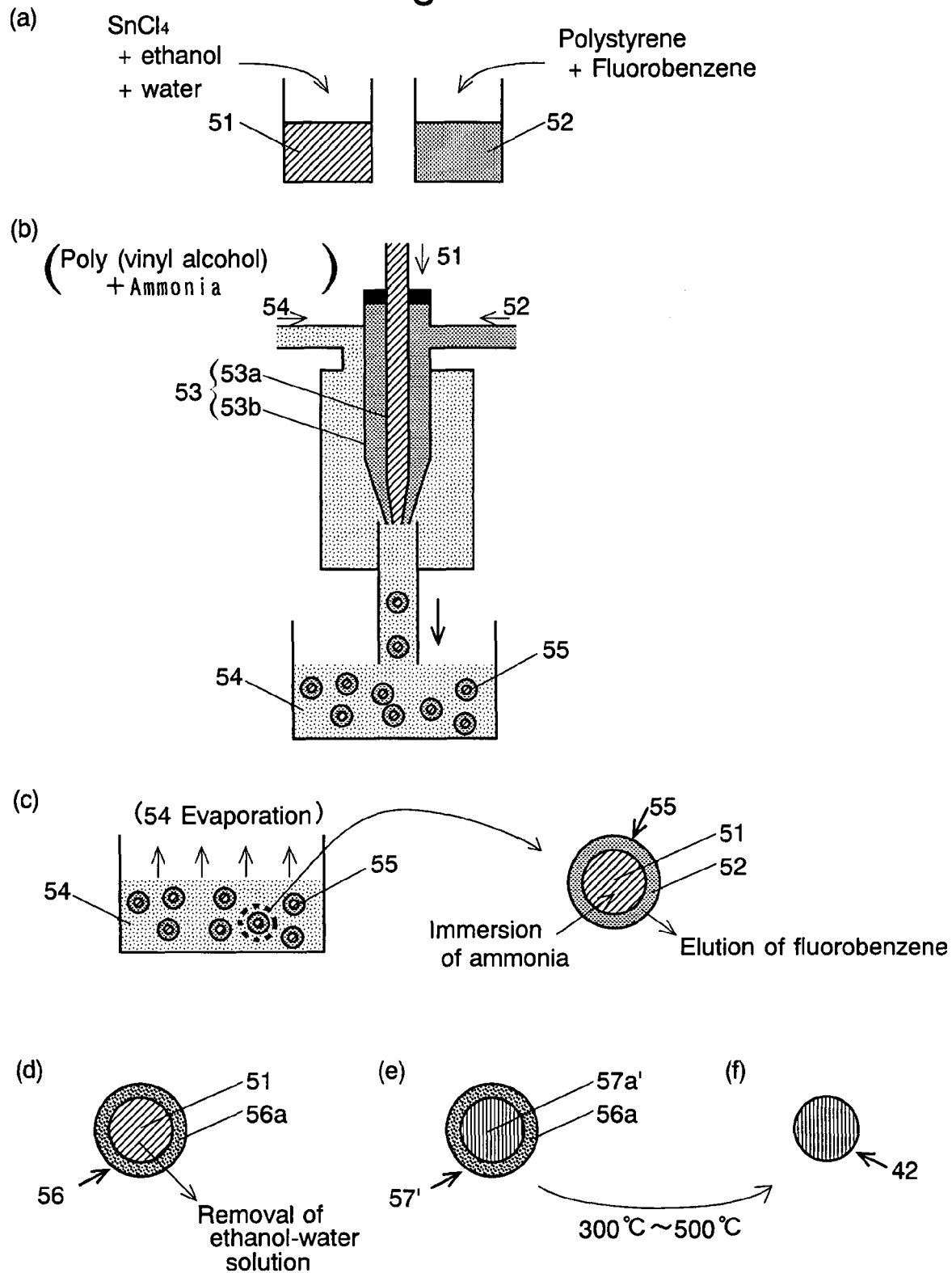
FIG. 14 A schematic view showing an embodiment of a method of manufacturing a solid heavy metal compound bead as the extreme ultraviolet light source target in accordance with the second aspect.

(2-2) Embodiment of Methods of Manufacturing of the Extreme Ultraviolet Light Source Target in Accordance with the Second Aspect An embodiment of methods of manufacturing the hollow heavy metal capsule 41 and the solid heavy metal compound bead 42 as the extreme ultraviolet light source targets will be described referring to FIGS. 13 and 14. First, referring to FIG. 13, the method of manufacturing the hollow heavy metal capsule 41 will be described. Next, using FIG. 14, the method of manufacturing the solid heavy metal compound bead 42 will be described focusing on differences between the method and the manufacturing method of the hollow heavy metal capsule 41.

Tin chloride is dissolved in an ethanol-water solution to prepare a tin solution 51 (FIG. 13(a)). Then, polystyrene is dissolved in fluorobenzene to prepare a polystyrene oil 52 (a). Next, a tube 53 of a double structure formed of an inner tube 53a and an outer tube 53b is used to flow out the tin solution 51 into the inner tube 53a and the polystyrene oil 52 between the inner tube 53a and the outer tube 53b from the front end of the double tube 53 (b). At this time, a drop dispersion medium 54 made of poly(vinyl alcohol) is passed to the outside of the double tube 53, thereby immersing the front end of the double tube 53 in the drop dispersion medium 54. Thereby, a drop 55 of double-layer structure formed of the tin solution 51 as its inner layer and the polystyrene oil 52 as its outer layer is formed in the drop dispersion medium 54. Fluorobenzene in the polystyrene oil 52 is gradually eluted in the drop dispersion medium 54 (c). As a result, a heavy metal solution inclusion resin capsule 56 which includes the tin solution 51 in a resin (polystyrene) capsule 56a is obtained. By placing the heavy metal solution inclusion resin capsule 56 under room temperature to 80° C. to evaporate the ethanol-water solution in the tin solution 51 (d), a heavy metal gel inclusion resin capsule 57 formed by adhering a geltinized tin oxide 57a to an inner wall surface of the resin capsule 56a is obtained (e). By heating the heavy metal gel inclusion resin capsule 57 at 300° C. to 500° C. to remove the resin capsule 56a, the hollow heavy metal capsule 41 is obtained (f).

Figure 15:
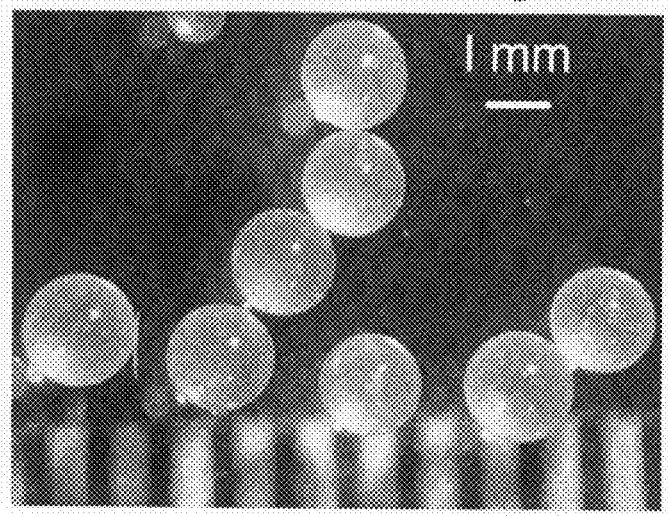
FIG. 15 An enlarged photo of a heavy metal gel inclusion resin capsule 57'.

When the hollow heavy metal capsule 41 is manufactured, the mixture of poly(vinyl alcohol) and ammonia is used as the drop dispersion medium 54 (FIG. 14(b)). In the step (c), ammonia passed through the outer layer of the drop 55 and entered into the heavy metal solution in the inner layer. In the step (d), ammonia served as a catalyst, accelerating gelation. Thereby, a heavy metal gel inclusion resin capsule 57' in which the gelated solid tin oxide 57a' is formed in the resin capsule 56a is obtained (e). FIG. 15 shows an enlarged photo of the heavy metal gel inclusion resin capsule 57'. The substantially spherical heavy metal gel inclusion resin capsule 57' having a substantially uniform diameter (about 1 mm) is obtained. In the same manner as described, by heating the heavy metal gel inclusion resin capsule 57' at 300° C. to 500° C. to remove the resin capsule 56a, the solid heavy metal compound bead 42 is obtained (f).

In this example, the diameter of the front end of the inner tube 53a is 0.1 mm, the density of the tin solution 51 is 1.0 g/cm$^3$ and the flow rate is 80 cm$^2$/s. Thus, a mass of tin in one extreme ultraviolet light source target 41 is 0.8 mg. The mass of tin is a mass just consumed by irradiation of one pulse of pulse laser beam with the intensity of $10^{10}$ W/cm$^2$ and the pulse width of 1 to 10 nanoseconds.

Figure 16:
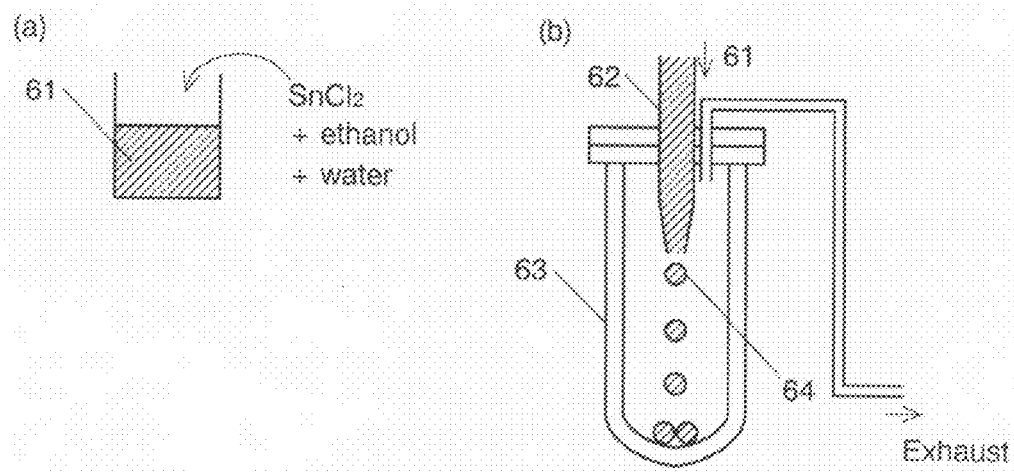
FIG. 16 A schematic view showing another embodiment of the method of manufacturing the solid heavy metal compound bead.

Another example of the method of manufacturing the solid heavy metal compound bead 42 will be described referring to FIG. 16.

Tin chloride is dissolved in the ethanol-water solution to prepare a tin solution 61 (a). Next, by flowing the tin solution 61 into a vacuum tower 63 from the front end of the tube 62 while cooling the solution 61, a drop 64 made of tin solution is formed (b). Immediately after entering into the vacuum, the drop 64 froze until it reached the bottom of the tower 63. By placing the frozen drop 64 on the bottom of the tower 63, that is, in the vacuum, the solvent in the drop 64 sublimed and freeze-dried. Thereby, the solid heavy metal compound bead 42 is obtained.

Figure 17:
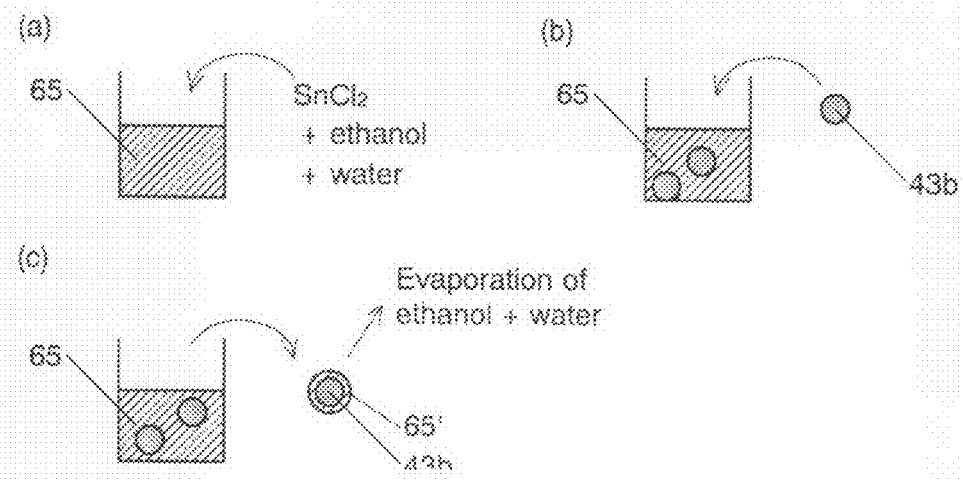
FIG. 17 A schematic view showing an embodiment of a method of manufacturing a core-coated target as the extreme ultraviolet light source target in accordance with the second aspect.

An embodiment of the method of manufacturing the coated-core target 43 will be described referring to FIG. 17.

Tin chloride is dissolved in the ethanol-water solution to prepare a tin solution 65 (a). Next, the core 43b made of polystyrene is immersed in the tin solution (b). By taking the core 43b out of the tin solution 65 and evaporating the ethanol in the tin solution 65' which is adhered to the core 43b (c), the core-coated target 43 is obtained.

Figure 18:
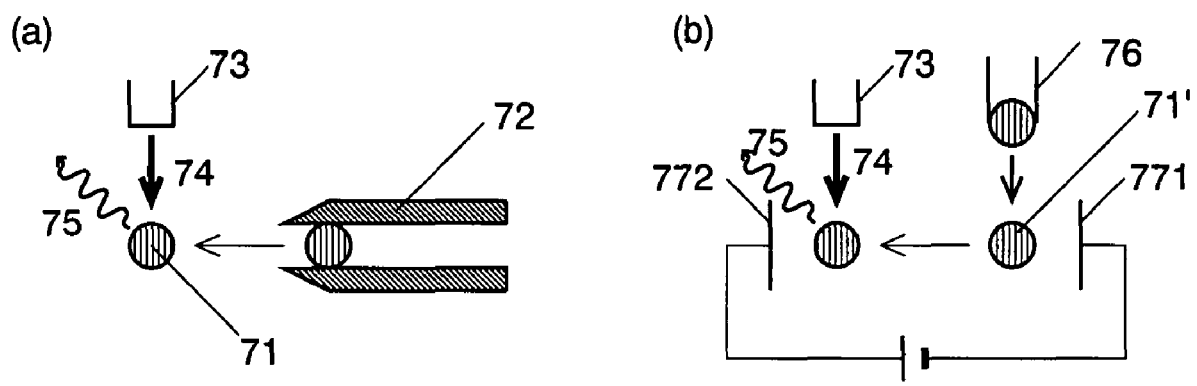
FIG. 18 A schematic view showing an example of a method of using the extreme ultraviolet light source target in accordance with the second aspect.

(2-3) Embodiment of a Method of Using the Extreme Ultraviolet Light Source Target in Accordance with the Second Aspect FIG. 18 shows an embodiment of a method of using the extreme ultraviolet light source target in accordance with the second aspect. According to the usage method shown in FIG. 18(a), a target 71 formed any of the hollow heavy metal capsule, the solid heavy metal compound bead or the core-coated target is emitted from an air gun 72 and is irradiated with a pulse laser beam 74 from a laser beam source 73. At this time, the target 71 is periodically emitted from the air gun 72 in sync with the pulse cycle of the pulse laser beam 74. Thus, the extreme ultraviolet light 75 can be repeatedly generated on the same cycle as the pulse cycle.

According to the usage method shown in FIG. 18(b), a target 71' obtained by charging the target 71 is used. An electrostatic field is applied between two electrodes 771, 772 and the target 71' is fed between the electrodes from the target source 76. The target 71' is fed between the electrodes 771, 772 from the target source 76 by falling the target 71' or emitting the target 71' from an air gun. The target 71' is accelerated between the electrodes 771, 772, moved to the irradiation position of the pulse laser beam 74 and irradiated with the pulse laser beam 74 to emit the extreme ultraviolet light 75. According to this method, similarly, since the target 71' is fed from the target source 76 in sync with the pulse cycle of the pulse laser beam 74, the extreme ultraviolet light 75 can be repeatedly generated on the same cycle as the pulse cycle.

The invention claimed is:

1. An extreme ultraviolet light and X-ray source target wherein the target is a matrix made of a polymeric material containing a heavy metal, the matrix containing one or more polymeric materials having a hydroxyl group, wherein
a shape of the target is a thin film.

2. The extreme ultraviolet light and X-ray source target according to claim 1, wherein the polymeric material having the hydroxyl group is hydroxylpropylcellulose, poly(vinyl alcohol) or poly(vinyl phenol).

3. The extreme ultraviolet light and X-ray source target according to claim 1, wherein a density of the heavy metal is 0.5% to 80% of the crystal density of the heavy metal.

4. The extreme ultraviolet light and X-ray source target according to claim 3, wherein the density of the heavy metal is 0.5% to 30% of the crystal density of the heavy metal.

5. The extreme ultraviolet light and X-ray source target according to claim 1, wherein the heavy metal is any of Ge, Zr, Mo, Ag, Sn, La, Gd and W.

6. The extreme ultraviolet light and X-ray source target according to claim 5, wherein the heavy metal is Sn.

7. The X-ray source target according to claim 1, wherein the heavy metal is Cu or Mo.

8. An extreme ultraviolet light and X-ray source target wherein the target is made of a heavy metal or compound of heavy metal of an amount just consumed by a shot of laser beam with a predetermined strength for a predetermined time, wherein
the target is shaped as a hollow capsule made of the heavy metal of the amount or of the compound containing the heavy metal of the amount.

* * * * *